(12) United States Patent
Katoh et al.

(10) Patent No.: US 8,080,823 B2
(45) Date of Patent: Dec. 20, 2011

(54) IC CHIP PACKAGE AND IMAGE DISPLAY DEVICE INCORPORATING SAME

(75) Inventors: Tatsuya Katoh, Osaka (JP); Satoru Kudose, Osaka (JP); Tomokatsu Nakagawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 116 days.

(21) Appl. No.: 12/312,982

(22) PCT Filed: Dec. 6, 2007

(86) PCT No.: PCT/JP2007/073603
§ 371 (c)(1),
(2), (4) Date: Sep. 29, 2009

(87) PCT Pub. No.: WO2008/072551
PCT Pub. Date: Jun. 19, 2008

(65) Prior Publication Data
US 2010/0025681 A1    Feb. 4, 2010

(30) Foreign Application Priority Data
Dec. 8, 2006 (JP) .................... 2006-332593

(51) Int. Cl.
*H01L 23/58* (2006.01)
*H01L 23/48* (2006.01)
*H01L 23/52* (2006.01)
*H01L 23/02* (2006.01)
*H01L 23/34* (2006.01)

(52) U.S. Cl. ........... 257/48; 257/690; 257/678; 257/723

(58) Field of Classification Search .................... 257/48, 257/690, 88, 668, 797, 678, 723, 734, 748, 257/781
See application file for complete search history.

(56) References Cited

U.S. PATENT DOCUMENTS

| | | |
|---|---|---|
| 2003/0155908 A1 | 8/2003 | Ohazama |
| 2003/0209815 A1 | 11/2003 | Ito et al. |
| 2006/0220665 A1 | 10/2006 | Akram et al. |
| 2007/0290302 A1 | 12/2007 | Nakagawa et al. |
| 2010/0025681 A1 | 2/2010 | Katoh et al. |

FOREIGN PATENT DOCUMENTS

| | | |
|---|---|---|
| JP | 08-153772 | 6/1996 |
| JP | 10-278280 | 10/1998 |
| JP | 10-284812 | 10/1998 |
| JP | 11-219974 | 8/1999 |
| JP | 2004-039702 | 2/2004 |
| JP | 2004-207566 | 7/2004 |
| JP | 2007-067315 | 3/2007 |
| JP | 2008-147401 | 6/2008 |

*Primary Examiner* — Chuong A. Luu
(74) *Attorney, Agent, or Firm* — Harness, Dickey & Pierce, P.L.C.

(57) ABSTRACT

A liquid crystal driver mounting package in accordance with an embodiment of the present invention contains a film base material and a liquid crystal driver connected to each other via an interposer. The liquid crystal driver includes first alignment marks on its face opposite the interposer. The interposer includes second alignment marks on its face opposite the liquid crystal driver. The first alignment marks and the second alignment marks are separated by about a distance which is in a tolerable range as a combining position where the liquid crystal driver and the interposer are attached when viewed from the normal of the face of the interposer opposite the liquid crystal driver. Thus, an IC chip (liquid crystal driver) package is provided which enables efficient positing of the IC chip and the interposer.

20 Claims, 11 Drawing Sheets

# IC CHIP PACKAGE AND IMAGE DISPLAY DEVICE INCORPORATING SAME

TECHNICAL FIELD

The present invention relates to packages having mounted thereto, for example, an IC chip with fine-pitched terminals and relates also to image display devices containing such mounting packages.

BACKGROUND ART

With the growing trend for a high resolution, high performance liquid crystal display device, liquid crystal drivers (IC chips) incorporated in the liquid crystal display device need to provide increasing numbers of outputs.

Typical IC chips satisfy this demand by reducing chip size or narrowing pitches for bumps on the chip. COF (chip on film) technology is recently popular whereby bare chip liquid crystal drivers which enable fine pitches are mounted.

Latest COF packaging applies heat and pressure in electrically connecting a tape carrier to an IC chip to couple the bumps on the IC chip to the inner leads on the tape carrier. To eliminate discrepancies in position between the bumps and the inner leads, the coupling method needs to utilize carrier tape material that hardly deforms under heat and enables high resolution. In other words, as finer pitches are pursued, more constraints are placed on choices for the tape carrier material.

This drawback is addressed, for example, by patent literature 1 which discloses a method of connecting an IC chip to a circuit board (tape carrier) via an interposer. FIG. 13 is a cross-sectional view of the package structure taken from patent literature 1.

As illustrated in FIG. 13, an IC chip 104 is flip-chip connected to the interposer 101. The interposer 101 is in turn connected by bumps to an electrode pattern 110 on a circuit board 107. The interposer 101 is a silicon (Si) substrate and produced by a Si wafer process so that the electrodes to which the IC chip 104 is connected have fine pitches equivalent to those of the electrodes on the IC chip 104. In contrast, the electrodes to which the circuit board 107 is connected are formed to match the relatively wide electrode pitches of the circuit board 107. The electrodes to which the IC chip 104 is connected are connected to the respective electrodes to which the circuit board 107 is connected on the interposer 101. The circuit board 107 may be a tape carrier.

The provision of the intervening interposer 101 enables redistribution of the fine pitches achieved in IC processes for the electrode pitches on the tape carrier. Applying this technique to the COF package allows relaxing the constraints on choices for the tape carrier base material even when the IC chip has extremely fine pitched electrodes as a result of the reduced size or increased number of outputs of the IC chip.

To provide the fine pitches, the IC chip 104 is connected to the interposer 101 by metal or alloy bumps that are relatively hard and have a high melting point (e.g., Au—Au joints by means of Au bumps). The use of such material resolves problems of short-circuiting between adjacent bumps by reducing bump deformation, which in turn allows for reduction in terminal pitch to about 25 μm and provision of large numbers of IC chip outputs.

Meanwhile, the interposer is connected to the tape carrier through terminals with greater pitches than the IC chip contacts, for example, with 50 to 100 μm pitches.

If the circuit board 107 is made of such a thin material, like a tape carrier or a film carrier, that one can see through the circuit board 107, the circuit board 107 and the interposer 101 can be aligned in attaching the circuit board 107 and the interposer 101 in the manufacture of the package while observing them on a face of the circuit board 107 opposite the interposer 101. This method cannot be used in aligning the interposer 101 and the IC chip 104 in attaching the interposer 101 and the IC chip 104 because the interposer 101 is made of, for example, silicon and too thick to see through and one cannot see through the IC chip 104 either.

Some IC chips have an exterior partially deformed out of design dimensions in dicing due to some reasons in manufacturing equipment although the deformation may not affect their performance. The interposer may be provided with marks designed to enable aligning to the exterior of the IC chip. However, since the marks are made according to the IC chip with as-designed dimensions, they do not enable accurate aligning in the packaging of a deformed IC chip.

Accordingly, patent literature 2 discloses aligning two substrates using alignment marks shown in FIG. 14. FIG. 14 is a schematic illustration of the shape of alignment marks and a method of aligning using the alignment marks in accordance with an embodiment of the present invention. In the figure, (a) is plan views of the two substrates, (b) is cross-sectional views along line A-A' and line B-B' of the substrates, and (c) is a drawing illustrating the substrates, one being placed on top of the other. As can be seen from FIG. 14, a first silicon substrate S1, which has a (100) plane, is provided with two rectangular alignment grooves 201a and 201a as alignment marks 201 running in the <110> direction. A second silicon substrate S2, which has a (100) plane, is similarly provided with two rectangular alignment grooves 202a and 202a as alignment marks 202 separated by a distance and running parallel in the <110> direction. The alignment grooves 202a and 202a on the second substrate S2 exactly match the alignment grooves 201a and 201a on the first silicon substrate S1 if rotated by 90°. Patent literature 2 describes that the alignment grooves are observed with the first substrate S1 being attached to the second substrate S2, by means of infrared, X-ray, or like transmitted light. With the first substrate S1 being correctly aligned to the second substrate S2, an overlapping pattern of the two marks 201 and 202 are observed as illustrated in (c) of FIG. 14.

CITATION LIST

Patent Literature 1
Japanese Patent Application Publication, Tokukai, No. 2004-207566 (Publication Date: Jul. 22, 2004)
Patent Literature 2
Japanese Patent Application Publication, Tokukaihei, No. 8-153772 (Publication Date: Jun. 11, 1996)

SUMMARY OF INVENTION

The alignment marks 201, 202 shown in FIG. 14 are fabricated by forming a resist pattern on the (100) silicon substrate by a conventional method using a photomask pattern obtained by combining the rectangles and subsequently etching out grooves to a depth of 30 μm or greater by anisotropic etching or a like technique. These steps are not irrelevant to the manufacture of the package shown in FIG. 13. Employing this approach inevitably adds new steps to the manufacturing process and leads to reduced package manufacturing throughput and increased manufacturing cost. The approach could be a cause for seriously cutting productivity if the packaging is to be geared for large-volume manufacturing as in the preceding description.

Apart from the aligning parallel to the surface of the interposer, it is also preferable to control the distance (gap) between the IC chip and the interposer in IC packaging. This is neither taught nor suggested by patent literatures 1 and 2.

The present invention, conceived in view of these problems, has an objective of providing an IC chip package in which positioning members for positioning an IC chip and an interposer are disposed without reducing package manufacturing throughput and also of providing an image display device incorporating the packages.

An IC chip package in accordance with the present invention is, to solve the problems, characterized in that it is an IC chip package in which an IC chip is mounted to a package base material via an interposer, the IC chip containing electrodes and first positioning members on a face thereof opposite the interposer, the first positioning members indicating a combining position for the IC chip and the interposer, the interposer containing wiring conductor and second positioning members on a face thereof opposite the IC chip, the wiring conductor having IC chip contacts electrically connected to the electrodes and package base material contacts electrically connected to the package base material, the second positioning members being provided in pairs with the first positioning members, the first positioning members being provided in the same layer as the electrodes and formed of the same material as the electrodes and/or the second positioning members being provided in the same layer as the wiring conductor and formed of the same material as the wiring conductor.

According to the arrangement, unlike conventional technology, the positioning members can be provided without reducing package manufacturing throughput. The arrangement therefore greatly restrains rise in manufacturing cost when compared with conventional arrangements.

According to the arrangement of the present invention, the first positioning members are formed of the same material as the electrodes and/or the second positioning members are formed of the same material as the wiring conductor. In other words, at least either the first positioning members and the second positioning members contain metal or like electrically conductive material. Therefore, the first and second positioning members, disposed on opposing parts of the IC chip and the interposer, are detected when the IC chip and the interposer are aligned by using light that is transmitted by the IC chip and the interposer (specifically, infrared laser or X-rays). Specifically, infrared laser or X-rays are emitted at the first and second positioning members from an external exposed face of the IC chip or the interposer. The infrared laser or X-rays transmit through the IC chip and the interposer, reflect off the first or second positioning members, and exit through the external exposed face. The output light is detected by a detector to visually recognize the positions of the first or second positioning members.

In addition, the IC chip package in accordance with the present invention is such that the first and second positioning members differ in shape and are provided so that the first and second positioning members are separated by about a distance which is in a tolerable range as the combining position when viewed from a normal to the opposing faces of the IC chip and the interposer with the IC chip and the interposer being attached at an optimal position.

For example, in large-volume production of product using manufacture lines, each product does not need to be literally manufactured with designed values. A certain level of tolerable error (sometimes called allowance) is often allowed so long as no inconveniences occur. However, the positioning technique disclosed in patent literature 2 can only determine whether or not the pattern of (c) of FIG. 14 is observed. In other words, the technique only gives one of two results: the positioning is accurate or inaccurate. Patent literature 2 is short of taking the tolerable error into consideration. Therefore, large-volume production with the technique of patent literature 2 yields numerous out-of-standard products. In contrast, the IC chip package of the present invention, owing to the arrangement, enables determination as to whether or not the IC chip and the interposer are positioned in a tolerable range as a combining position, that is, in a tolerable error range, simply by (visually) detecting the relative positions of the first and second positioning members. Efficient positing is thus possible.

According to the arrangement, even if the IC chip and the interposer are not positioned at an optimal position, that is, as designed, it can be verified whether or not they are positioned in the tolerable error range. Therefore, efficient positing is possible in large-volume production of packages when compared to conventional arrangements. Not many out-of-standard products are produced. The arrangement contributes to productivity improvement.

The IC chip package in accordance with the present invention is preferably such that: the face of the IC chip opposite the interposer is quadrilateral: and the first positioning members are provided in four corner areas of the quadrilateral.

According to the arrangement, the first positioning members can be provided without disrupting electrical connections between the IC chip and the interposer. Specifically, the IC chip package in accordance with the present invention has the first positioning members in the four corner areas of the quadrilateral and the second positioning members on parts of the interposer opposite the four corner areas.

In addition, the first positioning members are provided in all the (four) corner areas of the IC chip for positioning purposes. Accurate positioning is thus accomplished.

Meanwhile, the IC chip package in accordance with the present invention is by no means limited to the arrangement in which the first positioning members are provided in all the (four) corner areas of the IC chip. Alternatively, the first positioning members may be provided in two opposite corner areas of the quadrilateral across its center.

The provision in the two corner areas reduces the number of the members over the arrangement in which they are provided in the four corner areas as in the previous case. Package manufacturing steps and cost can be kept relatively low.

Specifically, when the IC chip has a rectangular face opposite the interposer, preferably, the first positioning members each stretch $\frac{1}{10}$ the long side of the rectangle from a corner of the rectangle and $\frac{1}{5}$ the short side of the rectangle from the corner of the rectangle.

According to the arrangement, the first positioning members (and the second positioning members) are readily observable without disrupting electrical connections between the IC chip and the interposer.

In the above-mentioned arrangement, preferably, each of the first positioning members provided in the two opposite corner areas across the center of the face of the IC chip opposite the interposer has a different shape. Specifically, preferably, the first positioning members provided in one of the two corner areas have the same shape as the second positioning members provided in pairs with those first positioning members.

According to the arrangement, if the interposer (or IC chip) is placed on the IC chip (or interposer) out of alignment by 180 degrees prior to positioning of the IC chip and the interposer, the first positioning members and the second positioning members which are not paired up are placed opposite each other. Positioning is thus impossible. The interposer and the chip cannot be attached. The IC chip cannot be misplaced. Accurate mounting and positioning are thus possible.

The IC chip package in accordance with the present invention is preferably such that the distance separating the first and second positioning members has at least two values, one of the values indicating a tolerable error and being greater than the other one of the values.

According to the arrangement, not only can it verified whether a tolerance limit is exceeded in positioning the IC chip and the interposer, two-level ranking of positioning precision is also possible.

Specifically, as the first positioning members and the second positioning members detailed above, either the first positioning members or the second positioning members each include a plurality of positioning members and are arranged to surround the other ones of the first and second positioning members when viewed from the normal. In the arrangement, preferably, the plurality of positioning members are two pairs of positioning members provided across the other ones; one of the two pairs is separated from the other ones by about a distance indicating a positional tolerance limit; and the other one of the pairs is separated from the other ones by a shorter distance than the previous distance.

A concrete example of this arrangement is such that: the positioning members are square; the other ones are shaped like crosses where two rectangles cross at centers thereof at right angles; and the positioning members are each provided between an extension from a center of one of the crosses and an adjacent extension from the center and positioned so that a corner of the square points at the center of the cross.

When the first and second positioning members are detected using light that is transmitted by the semiconductor as mentioned earlier, no metal-containing members other than the first and second positioning members are preferably located at positions where the first and second positioning members are located when the IC chip and the interposer are viewed from the normal.

According to the arrangement, no measurement errors occur in detecting the first and second positioning members due to reflection of the light transmitted by IC chip and the interposer off other members. Accurate positioning is thus possible.

An alternative to the light-based detection is, for example, to provide conductive projections on the opposing faces of the IC chip and the interposer to establish contacts, the projections having external output means, such as wires.

This arrangement enables external sensing of contacts between the projections of the first positioning members and the projections of the second positioning members by using the external output means. If such contacts occur, the positioning error is determined to have reached tolerance limit.

The IC chip package in accordance with the present invention is preferably such that: the electrodes and the IC chip contacts are electrically connected via bumps; the IC chip has, at a position thereon opposite the interposer, first gap measurement members for measuring a gap between the opposing faces of the IC chip and the interposer; and the interposer has, at a position thereon opposite the IC chip, second gap measurement members provided in pairs with the first gap measurement members. Specifically, the first gap measurement members and the second gap measurement members are preferably provided so that they appear next to each other when viewed from the normal to the opposing faces of the IC chip and the interposer.

According to the arrangement, the IC chip package of the present invention enables not only positioning parallel to the interposer surface, but also control of the distance (gap) separating the IC chip from the interposer. More accurate attaching is thus accomplished.

In addition, when the first positioning members are provided in two corner areas of the IC chip as detailed above, the first and second gap measurement members may be provided at such positions that those members appear in the two corner areas other than the previous two corner areas on the IC chip when viewed from the normal to the opposing faces of the IC chip and the interposer.

The first and second positioning members may double as the first and second gap measurement members.

Another IC chip package in accordance with the present invention is, to solve the problems, characterized in that it is an IC chip package in which an IC chip is mounted to a package base material via an interposer, the IC chip containing electrodes on a face thereof opposite the interposer, the interposer containing wiring conductor having IC chip contacts electrically connected to the electrodes and package base material contacts electrically connected to the package base material, the electrodes and the IC chip contacts being electrically connected via bumps, the IC chip having, at a position thereon opposite the interposer, first gap measurement members for measuring a gap between the opposing faces of the IC chip and the interposer, and the interposer having, at a position thereon opposite the IC chip, second gap measurement members provided in pairs with the first gap measurement members.

The arrangement enables control of the distance (gap) separating the IC chip from the interposer and hence evaluation as to whether the electrodes of the IC chip and the IC chip contacts of the interposer are sufficiently connected via the bumps.

The bumps on the electrodes of the IC chip and on the IC chip contacts of the interposer (or bumps either on the electrodes or on the contacts) are formed to a desirable height on the electrodes and IC chip contacts (or either on the electrodes or on the contacts) in manufacture. As the IC chip and the interposer are attached, the bumps are deformed slightly to a lower height. However, if the IC chip and the interposer are not sufficiently attached, the bumps may not be deformed at all or conversely, deformed excessively. According to the present invention, the bump deformation is evaluated by measuring the gap between the opposing faces of the IC chip and the interposer using the second gap measurement members provided in pairs with the first gap measurement members.

Specifically, preferably, the first and second gap measurement members are provided next to each other when viewed from a normal to the opposing faces of the IC chip and the interposer.

This arrangement, for example, enables measurement of the gap between the opposing faces of the IC chip and the interposer with a simple technique whereby the positions of the surfaces of the first and second gap measurement members are detected using the light detailed above and the difference thereof is obtained.

The IC chip package in accordance with the present invention is preferably such that: the face of the IC chip opposite the interposer is quadrilateral; and the first gap measurement members are provided in four corner areas of the quadrilateral.

According to the arrangement, the first gap measurement members can be provided without disrupting electrical connections between the IC chip and the interposer. Specifically, the IC chip package in accordance with the present invention has the first gap measurement members in the four corner areas of the quadrilateral and the second gap measurement members on parts of the interposer opposite the four corner areas.

In addition, the first gap measurement members are provided in all the (four) corner areas of the IC chip for measurement purposes. Accurate positioning is thus accomplished.

Meanwhile, the IC chip package in accordance with the present invention is by no means limited to the arrangement in which the first gap measurement members are provided in all the (four) corner areas of the IC chip. Alternatively, the first gap measurement members may be provided in two opposite corner areas of the quadrilateral across its center.

The provision in the two corner areas reduces the number of members over the arrangement in which they are provided in the four corner areas as in the previous case. Package manufacturing steps and cost can be kept relatively low.

Specifically, when the IC chip has a rectangular face opposite the interposer, preferably, the first gap measurement members each stretch 1/10 the long side of the rectangle from a corner of the rectangle and 1/5 the short side of the rectangle from the corner of the rectangle.

According to the arrangement, the first positioning members (and the second positioning members) are readily observable without disrupting the electrical connections between the IC chip and the interposer.

The IC chip package in accordance with the present invention is preferably such that, in the above-mentioned arrangement, the first and second gap measurement members are at a center of the opposing faces of the IC chip and the interposer when viewed from the normal to the opposing faces of the IC chip and the interposer.

Accordingly, the gap is measurable also at the center of the opposing faces of the IC chip and the interposer. More accurate attaching is thus accomplished. Good quality IC chip packages are provided.

In relation to the IC chip package, the first and second gap measurement members preferably have an area of at least 15 $\mu m^2$ when viewed from the normal to the opposing faces of the IC chip and the interposer. Preferably, the interposer is a semiconductor substrate on which an electric circuit is formed, and the first and second gap measurement members are composed of a material reflecting light transmitted by the semiconductor.

By setting the area to the values, for example, the first and second gap measurement members can effectively catch light when a technique is employed where light transmitted by the semiconductor is used to measure the gap as above. Stable measurement data can be collected.

The present invention is also applicable as a display image display member including: IC chip packages structured as above; and a display image display member, connected to the package base material in the IC chip packages, for displaying images from signal outputs from the IC chip.

The arrangement provides a highly reliable image display device.

Additional objectives, advantages and novel features of the invention will be set forth in part in the description which follows, and in part will become apparent to those skilled in the art upon examination of the following or may be learned by practice of the invention.

| | Reference Signs List |
|---|---|
| 1 | Liquid Crystal Driver Mounting Package (IC Chip Package) |
| 2 | Film Base Material (Package Base Material) |
| 3, 3' | Liquid Crystal Driver (IC Chip) |
| 3a | Drive Signal Output Terminal (Electrode) |
| 3b | Signal Input Terminal (Electrode) |
| 4a, 4b | interposer |
| 5, 6 | On-film Wire |
| 7 | Solder Resist |
| 8 | Device Hole |
| 11 | First Alignment Mark (First Positioning Member) |
| 12 | Second Alignment Mark (Second Positioning Member) |
| 12a-1 to 12a-4 | Mark Member |
| 13 | First Gap Measurement Member |
| 14 | Second Gap Measurement Member |
| 15 | Filling Material |
| 20 | Glass Substrate |
| 21 | Signal Line |
| 21a | Data Electrode Line |
| 21b | Gate Electrode Line |
| 22 | Thin Film Transistor (TFT) |
| 23 | Pixel Electrode |
| 24 | Pixel |
| 25 | Active Matrix Substrate |
| 26 | Liquid Crystal Layer |
| 27 | Opposite Substrate |
| 30a | Input Bump |

-continued

Reference Signs List

| | |
|---|---|
| 30b | Output Bump |
| 40 | Liquid Crystal Driver Connecting Bump |
| 41 | Film Base Material Connecting Bump |
| 45 | Output Terminal Section |
| 46 | Input Terminal Section |
| 47 | External Wiring Board |
| 51 | Liquid-crystal-driver-incorporating Display Device (Image Display Device) |
| 52 | Liquid Crystal Display Means (Image Display Member) |

DESCRIPTION OF EMBODIMENTS

An embodiment of a liquid crystal driver mounting package (IC chip package) in accordance with the present invention will be described. The description will refer to various preferred technical limitations in carrying out the invention. The scope of the invention is however by no means limited by the embodiment or drawings.

A liquid crystal driver mounting package will be first described in reference to FIGS. 1 to 8 in accordance with the present invention.

Figure 1:
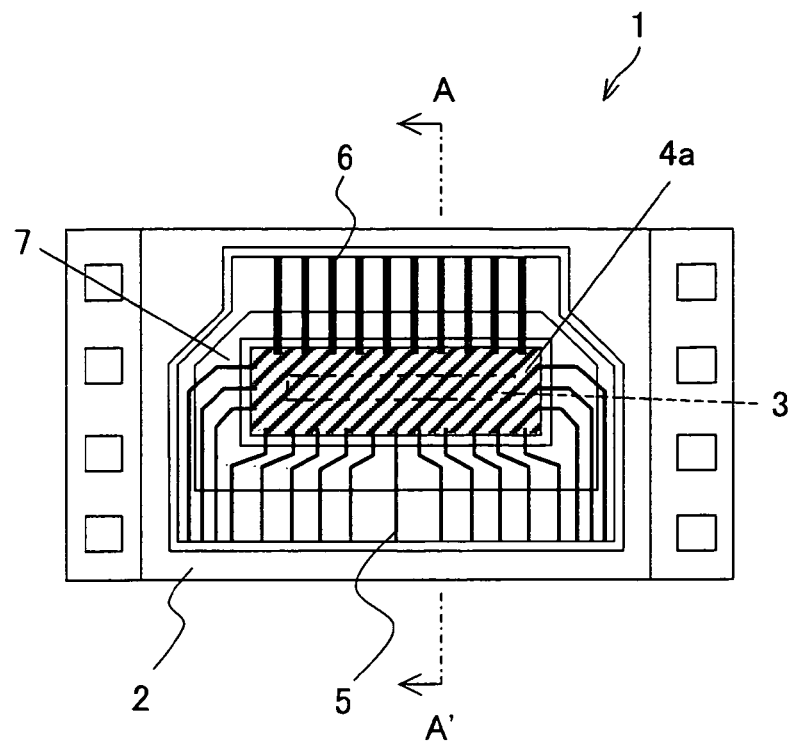
FIG. 1 is a plan view of the structure of a liquid crystal driver mounting package in accordance with embodiment 1 of the present invention.
Figure 2:
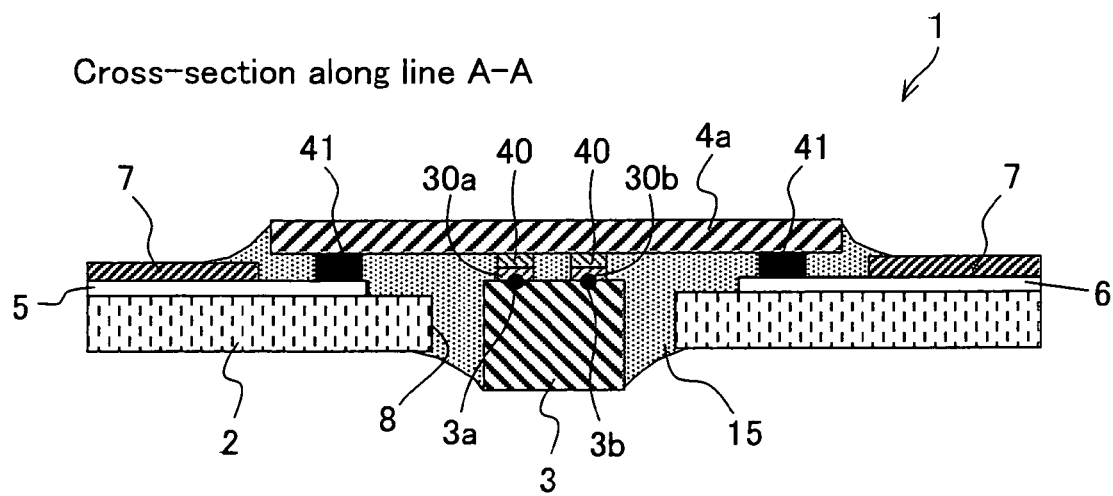
FIG. 2 is a cross-sectional view along line A-A' of the liquid crystal driver mounting package shown in FIG. 1.

FIG. 1 is a plan view of the structure of a liquid crystal driver mounting package in accordance with the present embodiment, as viewed from above an interposer 4a. FIG. 2 is a cross-sectional view along line A-A' of a liquid crystal driver mounting package 1 shown in FIG. 1. For convenience in description, FIG. 2 depicts the interposer 4a facing downward in the drawing and shows a part of the cross-section along line A-A'.

The liquid crystal driver mounting packages 1 of the present embodiment may be used as liquid crystal display member drive devices disposed adjacent to a liquid crystal display member around the display surface of the liquid crystal display member to drive the liquid crystal display member. The liquid crystal driver mounting package 1 therefore includes at least a film base material (package base material) 2, a liquid crystal driver (IC chip) 3, and an interposer 4a as illustrated in FIG. 1. Referring to FIG. 2, in the liquid crystal driver mounting package 1, the liquid crystal driver 3 is disposed in a device hole 8 in the film base material 2 and fixed to the film base material 2 through the interposer 4a. The present embodiment describes a COF (chip on film) liquid crystal driver mounting package in which wiring conductor (inner leads) on the film base material 2 face wiring conductor on the interposer 4a.

The liquid crystal driver 3 includes a plurality of liquid crystal drive circuits (not shown) so that it is capable of driving the liquid crystal display member. Each liquid crystal drive circuit is provided, as illustrated in FIG. 2, with a drive signal output terminal (electrode) 3a for outputting drive signals and a signal input terminal (electrode) 3b for inputting image data signals. The liquid crystal driver 3 that can be mounted to the liquid crystal driver mounting package 1 of the present embodiment has such a chip size that its face positioned opposite the interposer 4a measures 1×8 mm as an example. The chip may be polished for reduced thickness.

The interposer 4a may be constructed of a semiconductor material, preferably silicon. The size is not limited in any particular manner: for example, 2 mm×20 mm and 400 μm in thickness.

A filling material 15 shown in FIG. 2 is provided to cover parts of the liquid crystal driver 3 and the interposer 4a where they are positioned opposite each other, the device hole 8 in the film base material 2, and on-film wires 5, 6 to protect connections from external environment.

Now, details will be given on the liquid crystal driver 3 and the interposer 4a which embody feature arrangements of the present invention.

Figure 3:
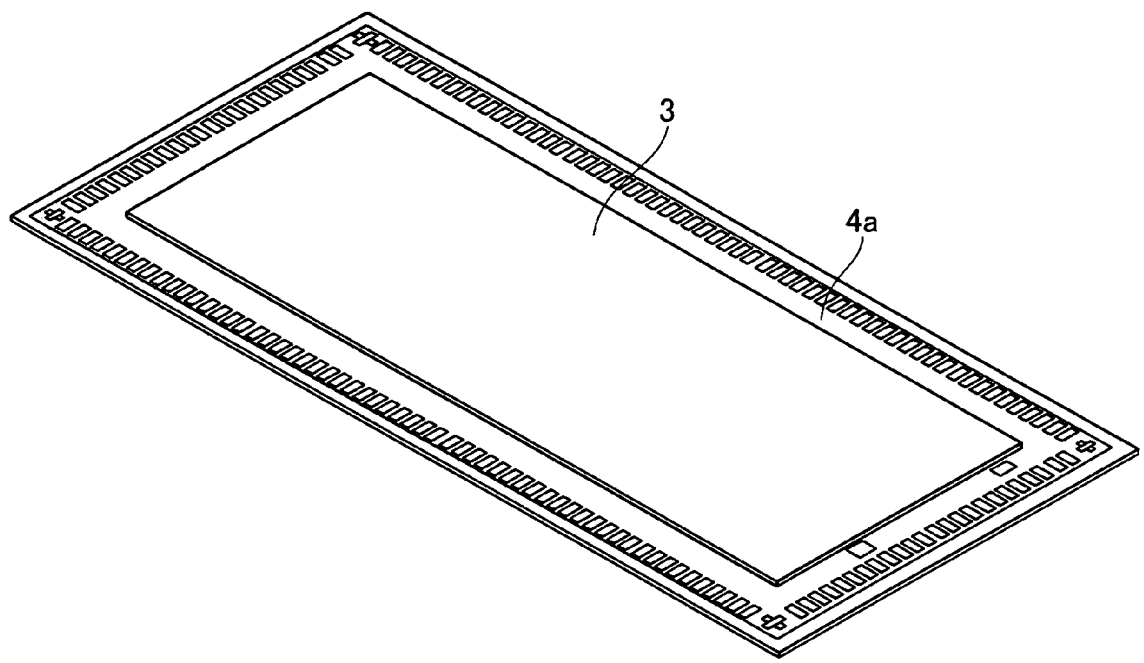
FIG. 3 is an oblique view of the structure of a liquid crystal driver and an interposer provided in the liquid crystal driver mounting package shown in FIG. 1.
Figure 4:
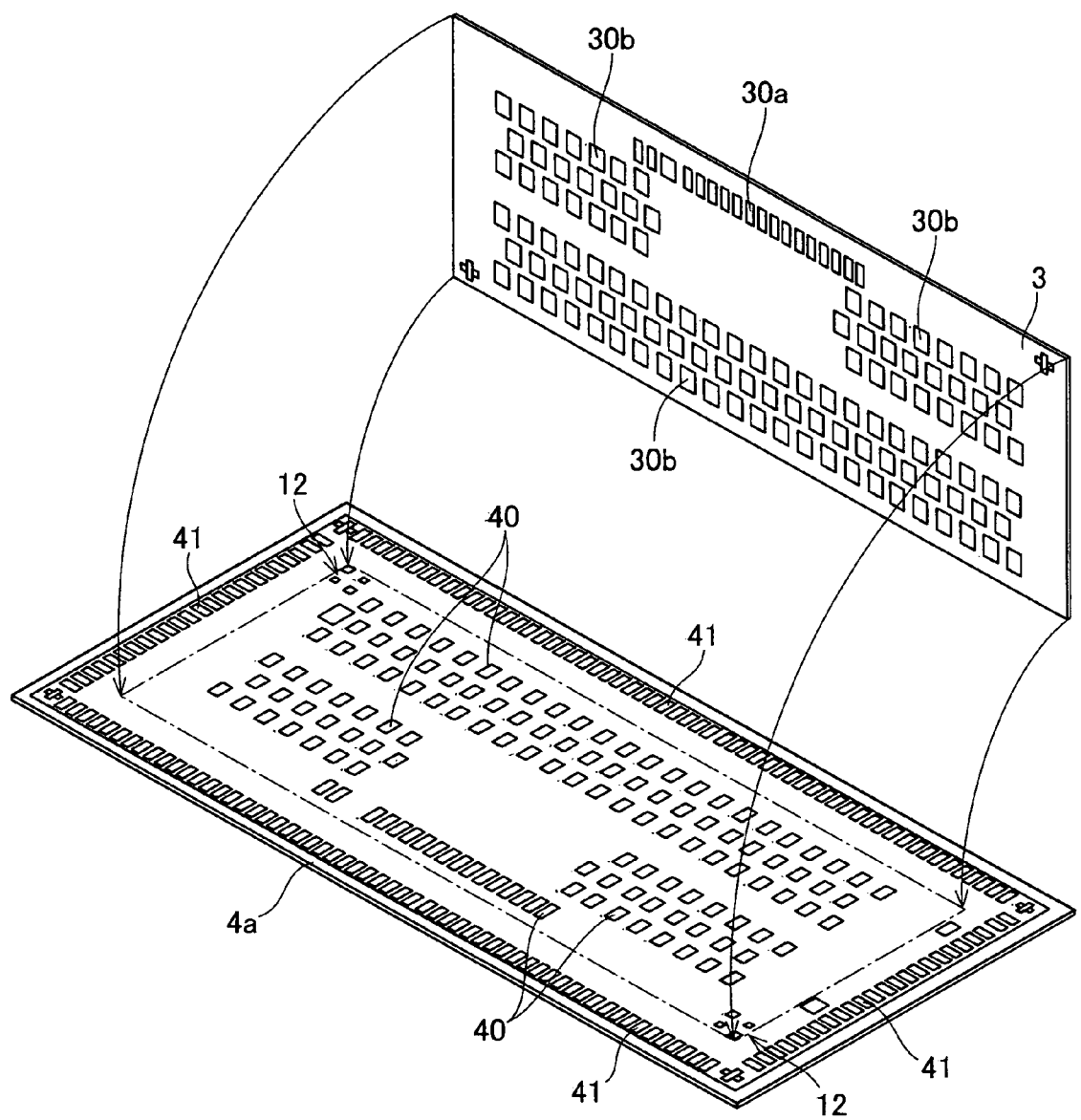
FIG. 4 is a drawing illustrating the structure of the opposing faces of the liquid crystal driver and the interposer provided in the liquid crystal driver mounting package shown in FIG. 1.

FIG. 3 is an oblique view of the liquid crystal driver 3 and the interposer 4a which were removed from the liquid crystal driver mounting package 1 shown in FIG. 1. The liquid crystal driver 3 is mounted (attached) to the interposer 4a. Meanwhile, FIG. 4 is a drawing illustrating the structure of the opposing faces of the interposer 4a and the liquid crystal driver 3 with the liquid crystal driver 3 detached from the interposer 4a. For convenience in description, The interposer 4a in FIG. 3 is shown to have only film base material connecting bumps 41 provided on film base material connecting terminals to connect to the terminals of the wiring conductor on the film base material 2 shown in FIG. 2. The wiring conductor, on the interposer, which connects at its ends to the film base material connecting terminals is not shown. The wiring conductor on the interposer is not shown in FIG. 4 either for convenience in description.

The liquid crystal driver 3 has the drive signal output terminals 3a and the signal input terminals 3b (FIG. 2) as mentioned above. The liquid crystal driver 3 of the present embodiment, which is not directly mounted to the film base material, but is connected to the film base material through the interposer 4a, allows relatively free arrangement of terminals when compared with the driver that is directly mounted to the film base material because the liquid crystal driver 3 does not required the terminals to be arranged according to the wiring on the film base material. Thus, the liquid crystal driver 3 of the present embodiment allows the drive signal output terminals 3a to be arranged in rows as illustrated in FIG. 4. This provision of the drive signal output terminals 3a in rows can reduce the chip size when compared with the drive signal output terminals that are arranged in a single row along a long side of the liquid crystal driver. More specifically, the drive signal output terminals 3a in each row of the liquid crystal driver 3 of the present embodiment are, as illustrated in FIG. 4, offset from those in adjacent rows so that each terminal is positioned right next to the separation between the nearest terminals in the adjacent rows. The arrangement allows further reductions in chip size of the liquid crystal driver 3. In the liquid crystal driver 3 of the present embodiment, it is only the drive signal output terminals 3a that have the arrangement detailed above; the signal input terminals 3b are arranged in a single row. This is by no means limiting the present invention. The signal input terminals 3b may be arranged in the same fashion as the drive signal output terminals 3a shown in FIG. 4.

Bumps are formed as illustrated in FIG. 4 on the drive signal output terminals 3a and the signal input terminals 3b shown in FIG. 2. In FIG. 4, those bumps on the signal input terminals are identified as input bumps 30a, and those on the drive signal output terminals as output bumps 30b. The input bumps 30a and the output bumps 30b do not need to be arranged as shown in FIG. 4 and may be suitably rearranged according to the positions of the drive signal output terminals and the signal input terminals.

The liquid crystal driver 3 further includes first alignment marks (first positioning members) 11 on faces where the drive signal output terminals 3a, the signal input terminals 3b, the input bumps 30a, and the output bumps 30b are provided. Specifically, the first alignment marks 11 are formed at two opposite corner areas of the face where the drive signal output terminals 3a and the signal input terminals 3b are provided.

The corner areas will be described next in reference to FIG. 5 which is a plan view of the liquid crystal driver 3 and the interposer 4a shown in FIG. 3. The corner areas are identified as area A and area B in FIG. 5. Area A stretches 1/10 the long side of the liquid crystal driver 3 and 1/5 the short side from its corner A. Likewise, area B stretches 1/10 the long side of the liquid crystal driver 3 and 1/5 the short side from its corner B. These areas do not affect the connections of the input bumps 30a and the output bumps 30b to liquid crystal driver connecting bumps 40 on the interposer 4a and the efficient routing the wiring conductor of the interposer and IC chip. It is therefore preferable to provide the first alignment marks 11 in the areas.

Figure 6:
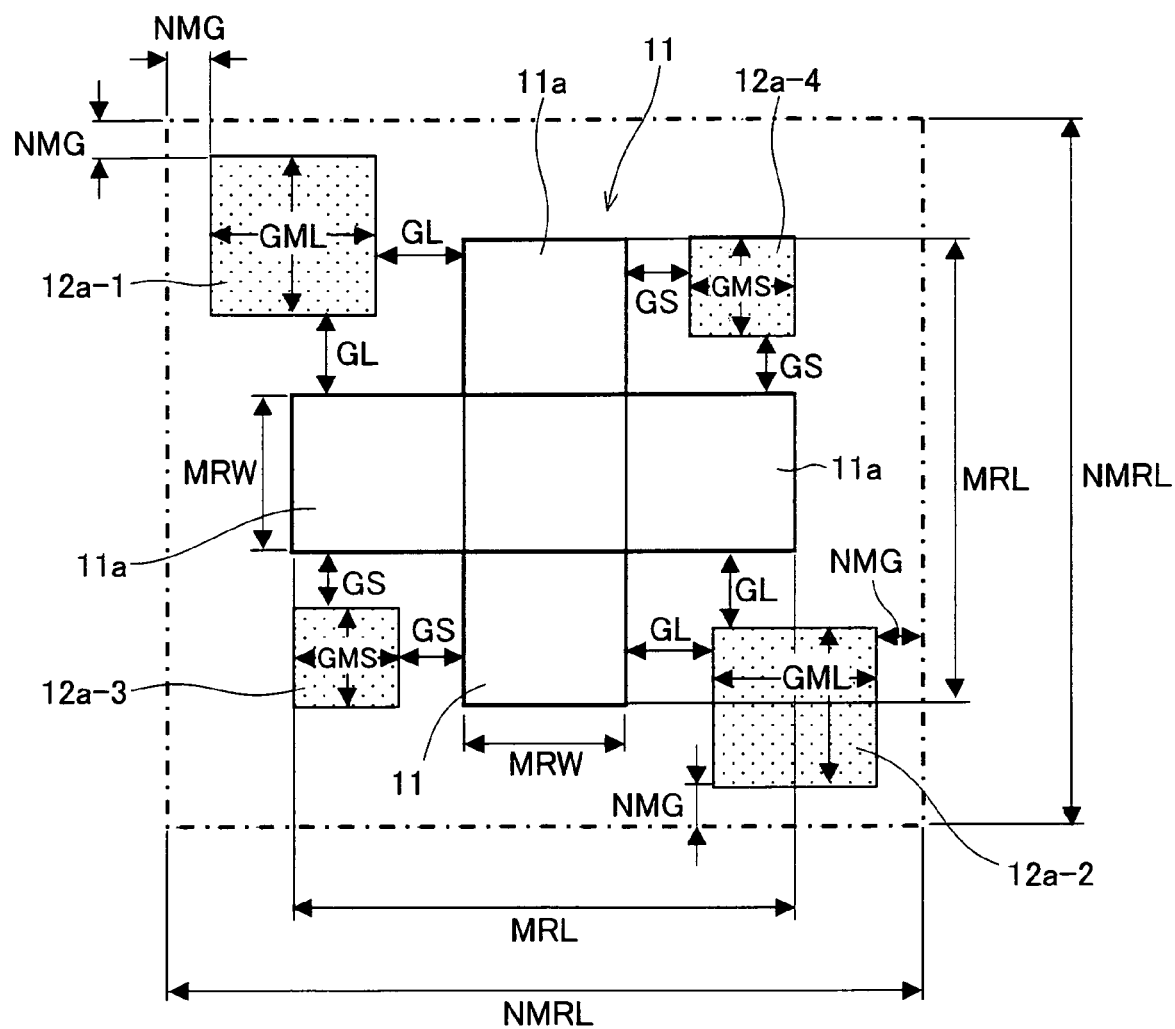
FIG. 6 is a drawing illustrating the relative positions of first alignment marks and second alignment marks provided on the liquid crystal driver mounting package shown in FIG. 1.

Each first alignment mark 11 is formed by two rectangles positioned to cross at their centers at right angles as illustrated in FIG. 4 to have a cross-like shape with four branches 11a (FIG. 6). The first alignment mark 11 may be made of the same material as the drive signal output terminals 3a and the signal input terminals 3b: namely, aluminum, copper, and gold among other examples.

As illustrated in FIG. 4, the interposer 4a includes the film base material connecting bumps 41, the liquid crystal driver connecting bumps 40, and wiring conductor (not shown) on a face opposite the face of the liquid crystal driver 3 where the input bumps 30a and the output bumps 30b are provided.

The film base material connecting bumps 41 are formed on the terminals at one ends of the wiring conductor (not shown) on the interposer 4a. The liquid crystal driver connecting bumps 40 are formed on the terminals at the other ends of the wiring. The liquid crystal driver connecting bumps 40 are clustered at the central part of the surface of the interposer 4a as illustrated in FIG. 4 so that they match the layout of the input bumps 30a and the output bumps 30b on the liquid crystal driver 3. The film base material connecting bumps 41 are positioned closer to the edge than are the liquid crystal driver connecting bumps 40.

The interposer 4a also has second alignment marks (second positioning members) 12 in the same layer as the wiring conductor on the face where the liquid crystal driver connecting bumps 40 are provided.

Figure 5:
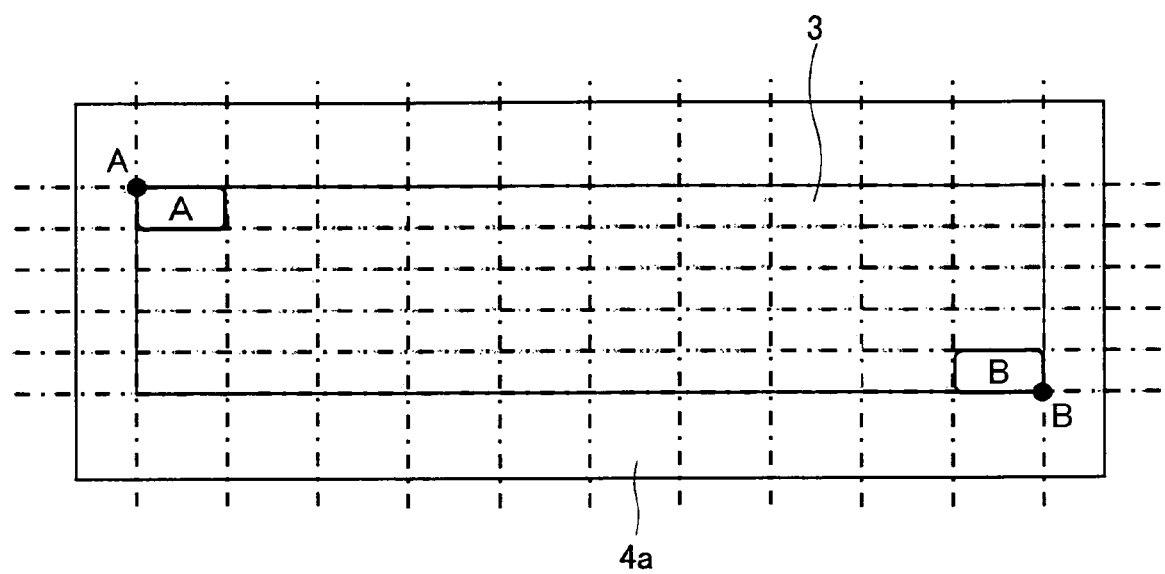
FIG. 5 is a plan view of the structure of the liquid crystal driver and the interposer provided in the liquid crystal driver mounting package shown in FIG. 1.

The second alignment marks 12 are provided in the areas opposite areas A and B of the liquid crystal driver 3 shown in FIG. 5 so that the first alignment marks 11 and the second alignment marks 12 are next to each other when observed from the normal to the face of the interposer 4a where the liquid crystal driver connecting bumps are 40 provided.

Each set of second alignment marks 12 is made up of four square mark members (positioning members) 12a of the same material as the wiring conductor.

Next, the structure of the second alignment marks 12, as well as positional relation with the first alignment marks 11, will be described more specifically in reference to FIG. 6.

FIG. 6 is a drawing of a first alignment mark 11 and a set of second alignment marks 12 in area A or B as observed from the normal to face of the liquid crystal driver 3 where the input bumps 30a and the output bumps 30b are provided. FIG. 6 shows relative positions of the first alignment mark 11 and the set of second alignment marks 12 when the liquid crystal driver 3 is optimally positioned relative to the interposer 4a.

The first alignment mark 11 has, as mentioned earlier, has four branches 11a forming a cross-like shape. The marks 11 and 12 are arranged so that a mark member 12a constituting the set of second alignment marks 12 can be observed between an adjacent pair of branches 11a at a predetermined distance from each branch 11a. Therefore, four mark members 12a are provided. The mark members 12a are divided into two groups depending on dimensions. Of the four mark members 12a-1 to 12a-4, the mark members 12a-1 and 12a-2 are larger in size than the other mark members 12a-3 and 12a-4. The mark members 12a-1 and 12a-2 are arranged so that they are observable at a distance of about GL away from the first alignment mark 11 in the state shown in FIG. 6. The mark members 12a-3 and 12a-4 are arranged so that they are observable at a distance of about GS away from the first alignment mark 11 in the state shown in FIG. 6 wherein GS<GL.

If the liquid crystal driver 3 and the interposer 4a are optimally positioned, the first alignment mark 11 and the second alignment marks 12 appear as in FIG. 6 when observed from the normal to the face of the liquid crystal driver 3 where the input bumps 30a and the output bumps 30b are provided. In the present embodiment, even when the marks 11 and 12 do not appear as in FIG. 6 in the observation, the positioning may be completed to combine the liquid crystal driver 3 and the interposer 4a if the first cross-shaped alignment mark 11 is visible in the gaps between the cross formed by the four mark members 12a-1 to 12a-4.

The distances GL and GS are equivalent to a distance of a tolerable range as combining positions. The mark members 12a-1 and 12a-2 separated by about the distance GL indicate a position that is a maximum tolerance as combining positions for the liquid crystal driver 3 and the interposer 4a. If the first alignment mark 11 appears overlapping the mark members 12a-1 and 12a-2 in the observation during positing, the driver 3 and the interposer 4a need to be repositioned. The mark members 12a-3 and 12a-4 separated by about the distance GS indicate a position in a state closer to an optimal position in a tolerable range as combining positions for the liquid crystal driver 3 and the interposer 4a.

These predetermined distances between the first alignment mark 11 and the mark members 12a-1 to 12a-4 are very convenient in repositioning to the optimal position, that is, the state shown in FIG. 6 because it is readily known by what distance the liquid crystal driver 3 should be moved relative to the interposer 4a.

In the present embodiment, the provision of the mark members 12a-3 and 12a-4 separated by about the distance GS, apart from the mark members 12a-1 and 12a-2 separated by about the distance GL, enables ranking of positioning precision. For example, in the present embodiment, the first alignment mark 11 may be ranked A (excellent) if it is out of the position in FIG. 6 (optimal position) by no greater than the distance GS and ranked B (good) if it is out of the position by from the distance GS but no greater than the distance GL (tolerance limit).

The relative positions of the first alignment mark 11 and the mark members 12a-1 to 12a-4 may be observed using light that is transmitted by the semiconductor. The light is emitted at the first alignment mark 11 and the mark members 12a-1 to 12a-4 from opposite the face of the liquid crystal driver 3 where the input bumps 30a and the output bumps 30b are provided or from opposite the face of the interposer 4a where the liquid crystal driver connecting bumps 40 are provided. Reflection of the light off the first alignment mark 11 and the mark members 12a-1 to 12a-4 is then detected to observe the relative positions of the first alignment mark 11 and the mark members 12a-1 to 12a-4 in the state shown in FIG. 6. Examples of the light include infrared and X-rays.

Since the relative positions of the first alignment mark 11 and the mark members 12a-1 to 12a-4 are recognized from the reflection of emitted light as mentioned above, it is preferable if no other structural members that may reflect the light or disrupt the emission of the light are disposed on and near the first alignment mark 11 and the mark members 12a-1 to 12a-4 in the liquid crystal driver mounting package 1 of the present embodiment. Examples of such structural members include metal-containing members.

The following table gives values of the distances shown in FIG. 6.

TABLE 1

| Symbol | on IC (μm) | on IP (μm) | Note |
|---|---|---|---|
| MRW | 20 | — | Length of Short Side of Rectangle (First Alignment Mark) |
| MRL | 60 | — | Length of Long Side of Rectangle (First Alignment Mark) |
| GML | — | 20 | Length of Side of Mark Member (Large) |
| GMS | — | 12.5 | Length of Side of Mark member (Small) |
| GL | 10 | | Distance between First Alignment Mark and Mark Member (Large) |
| GS | 7.5 | | Distance between First Alignment Mark and Mark Member (Small) |
| NMG | | ≧10 | Distance of Metal Disposition Prohibited Area |
| NMRL | | ≧100 | Length of Metal Disposition Prohibited Area |

The "metal disposition prohibited area" in the table refers to an area where it is prohibited to dispose other structural members which may disrupt the emission of the light. The "IC" in the table refers to the liquid crystal driver 3. The "IP" in the table refers to the interposer 4a.

Figure 7:
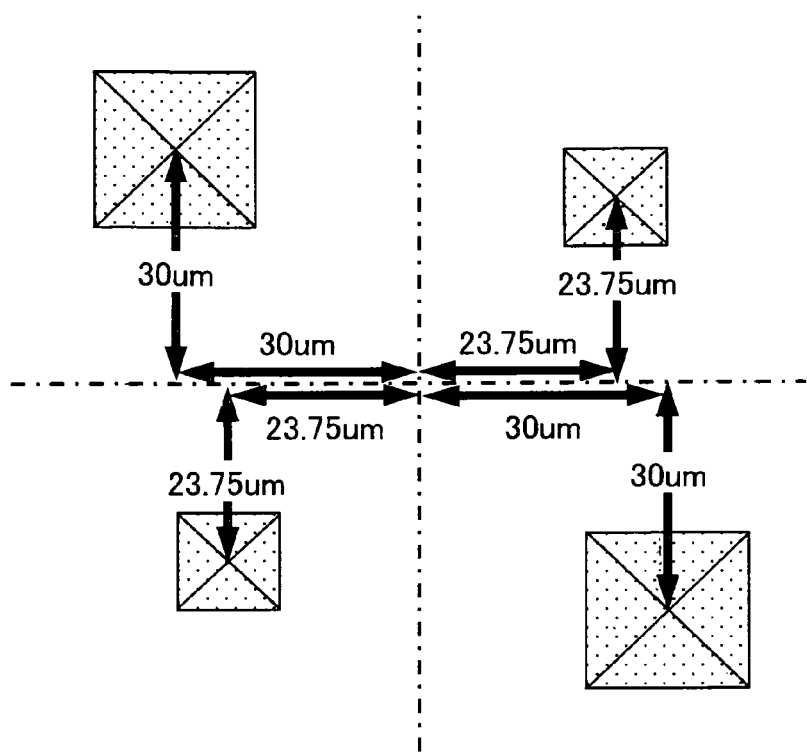
FIG. 7 is a drawing illustrating the relative positions of mark members constituting the second alignment marks shown in FIG. 6.

FIG. 7 shows the relative positions of the mark members 12a-1 to 12a-4 with respect to one another.

The first alignment mark 11 and the second alignment mark 12 may be designed to have a height of 1 μm (measured respectively from the face where the input bumps 30a and the output bumps 30b are provided and from the face where the liquid crystal driver connecting bumps 40 are provided). With this height of 1 μm being employed, the first alignment mark 11 appears overlapping the second alignment marks 12 as mentioned earlier if the liquid crystal driver 3 and the interposer 4a are not correctly positioned. This is however by no means the only possibility for the present invention. Alternatively, the first alignment mark 11 and the second alignment marks 12 may be adapted to touch each other during positing. To achieve this structure, it is preferable to design conductive projections of the same substance and with the same height for the first alignment mark 11 and the second alignment marks 12 as the electrodes and contacts on the IC chip.

Furthermore, the relative positions of the first alignment mark 11 and the second alignment marks 12 may be detected electrically, instead of being imaged, for positioning if the first alignment mark 11 and the second alignment marks 12 are structured to touch each other as immediately above. To implement the method, external output means, such as wiring, needs to be provided for the first alignment mark 11 and the second alignment marks 12 so that electric current occurs or changes when the first alignment mark 11 touches the second alignment marks 12 (let us suppose that the mark 11 touches the marks 12a-1 and 12a-2 shown in FIG. 6). In the absence of such a phenomenon, the liquid crystal driver 3 and the interposer 4a are determined to be positioned in a tolerable range as combining positions.

The liquid crystal driver 3 and the interposer 4a, after being positioned by the above techniques, are connected by a conventional publicly known technique. Specifically, for example, when the bumps are made of gold, the interposer 4a and the liquid crystal driver 3 are heated to about 430° C. and placed under a load to join the bumps to form electrical connects.

The film base material 2 and the interposer 4a may be attached by detecting discrepancy in position off the interposer 4a by observation through the film base material 2 on the face of the film base material 2 opposite the interposer 4a, adjusting, and electrically connecting the film base material connecting terminals of the wiring conductor on the interposer 4a to the on-film wires 5, 6 on the film base material 2 shown in FIG. 2. The connection may use the bumps 9 (FIG. 2) provided on the film base material connecting terminals, wherein the film base material 2 and the interposer 4a may be heated to about 430° C. as is the case with the connection between the interposer 4a and the liquid crystal driver 3 and placed under a load to establish the connection. The liquid crystal driver 3 may be mounted to the interposer 4a which is then mounted to the film base material 2. Alternatively, the interposer 4a may be mounted to the film base material 2 after which the liquid crystal driver 3 is mounted to the interposer 4a. Either method may be used. The on-film wires 5 and 6 preferably have solder resist 7 (FIG. 2) disposed on their surface to protect the on-film wires 5 and 6.

As described in the foregoing, according to the arrangement of the present embodiment, the first alignment marks 11 are provided in the same layer as the drive signal output terminals 3a and the signal input terminals 3b and from the same material as the drive signal output terminals 3a and the signal input terminals 3b, and the mark members 12a-1 to 12a-4 are provided in the same layer as the wiring conductor and from the same material as the wiring conductor. Therefore, the first alignment marks 11 may be fabricated in the same step as the drive signal output terminals 3a and the signal input terminals 3b are fabricated, and the mark members 12a-1 to 12a-4 may be fabricated in the same step as the wiring conductor. The alignment marks can therefore be formed without reducing throughput when compared with the conventional structure where alignment grooves are formed on the substrate.

In addition, in the present embodiment, the mere (visual) detection of the relative positions of the first alignment marks 11 and the second alignment marks 12 enables determination as to whether the liquid crystal driver 3 and the interposer 4a are positioned in a tolerable range as combining positions, that is, in a tolerable error range, in positioning the liquid crystal driver 3 and the interposer 4a. Efficient positioning is thus feasible.

According to the arrangement, even if the liquid crystal driver 3 and the interposer 4a are not positioned optimally, that is, as designed, it can be still checked if the driver 3 and the interposer 4a are positioned in a tolerable error range. More efficient positioning is possible in large-volume production of the package than conventional structure as explained earlier. For example, repositioning is avoided if the discrepancies in position are not so serious as to affect performance. The arrangement thus improves productivity.

Figure 8:
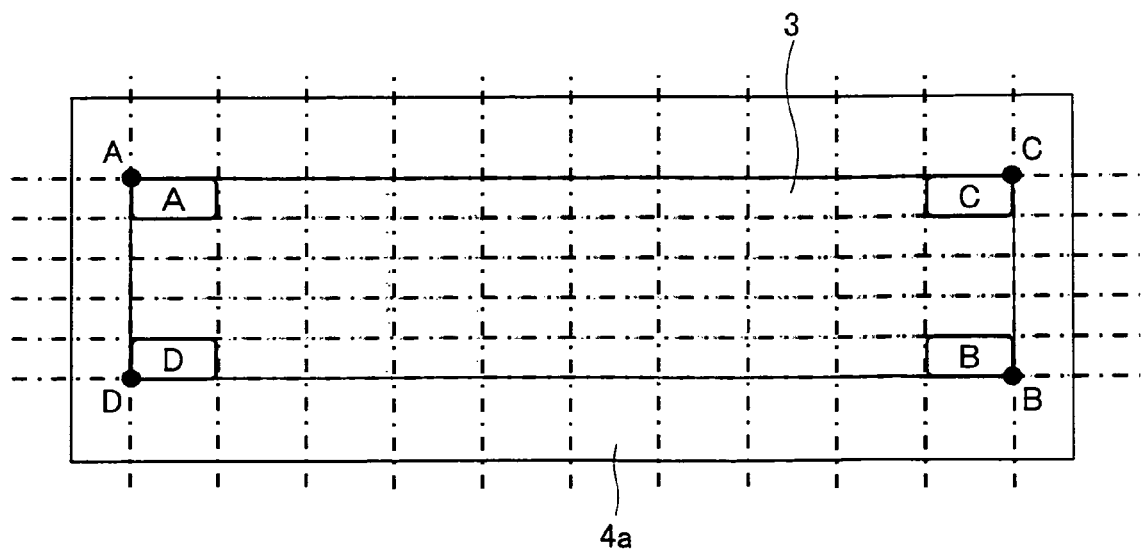
FIG. 8 is a plan view of the structure of the liquid crystal driver and the interposer provided in the liquid crystal driver mounting package shown in FIG. 1.

In the present embodiment, the first alignment marks 11 and the second alignment marks 12 are provided in two areas shown in FIG. 5: area A and area B. The present invention is by no means limited to this arrangement. The marks 11 and 12 may be provided in area C and area D in the same manner as in area A and area B as illustrated in FIG. 8, as well as in area A and area B. The structure enables more accurate positing. Meanwhile, the structure described above in the present embodiment where the marks are provided only in two areas (area A and area B) involves fewer members and fewer steps to manufacture the package, and requires less manufacturing cost, than the structure where the marks are provided in four areas (areas A to D).

In the present embodiment, as illustrated in FIG. 4, the cross-shaped first alignment marks 11 are provided on the liquid crystal driver 3, and the second alignment marks 12 each composed of four squares are provided on the interposer 4a. However, the present invention is by no means limited to this arrangement. The marks 11 and the marks 12 may be provided on the interposer 4a and the liquid crystal driver 3 respectively.

Furthermore, in the present invention, the cross-shaped alignment marks may be provided in area A of the liquid crystal driver 3, and the alignment marks composed of four squares provided on the interposer 4a may be provided in area B of the liquid crystal driver 3. In that case, the cross-shaped alignment marks may be provided in area B of the interposer 4a. In the arrangement, if the liquid crystal driver 3 is placed on the interposer 4a out of alignment by 180 degrees ("upside down" in FIG. 4) prior to positioning, the oppositely placed alignment marks do not match and the placement error is detected, allowing correction before positioning.

Now, referring to FIG. 12, a liquid-crystal-driver-incorporating display device (image display device) including liquid crystal driver mounting packages 1 of the present embodiment will be described.

Figure 12:
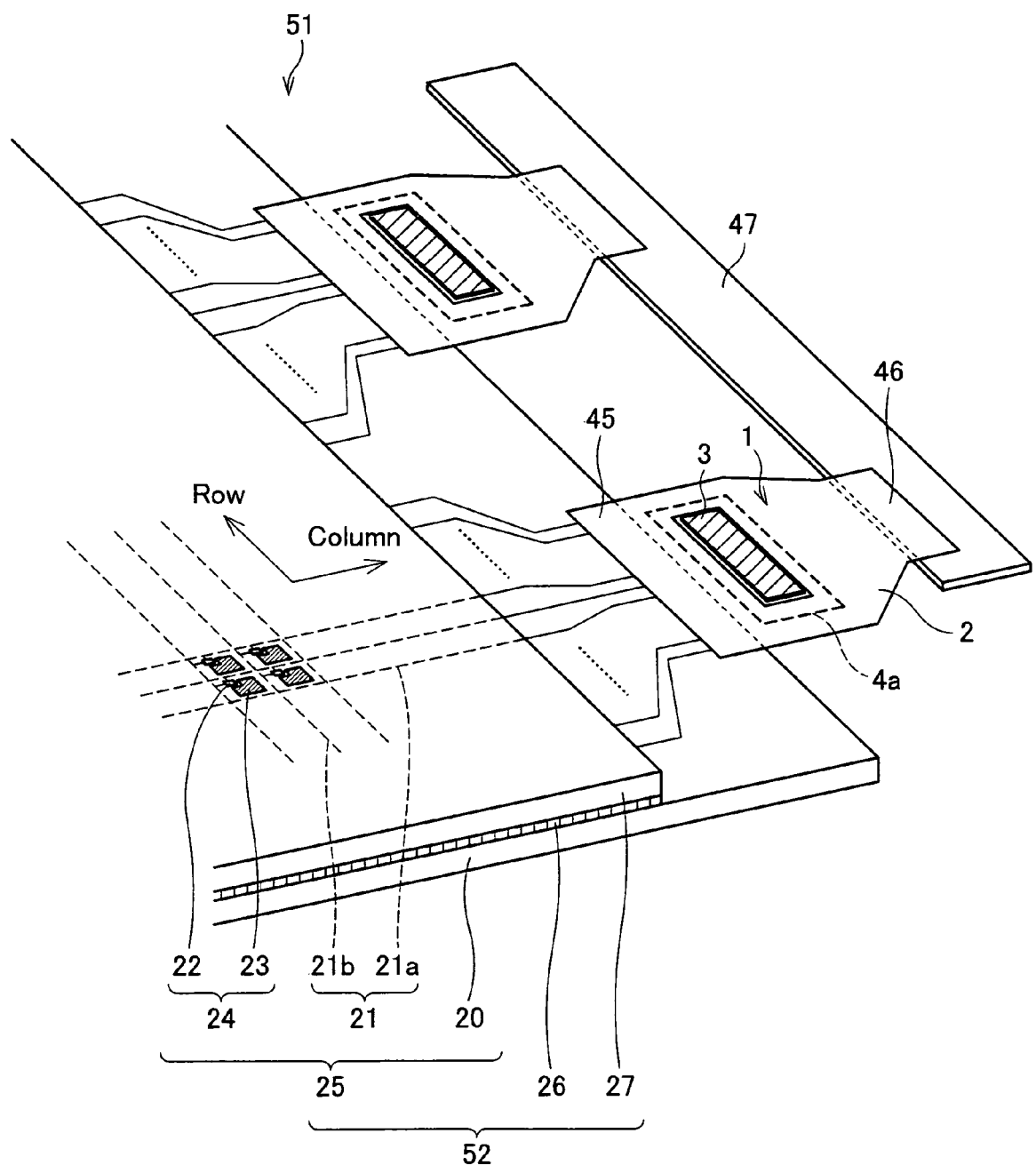
FIG. 12 is a drawing illustrating the structure of a liquid-crystal-driver-incorporating display device incorporating liquid crystal driver mounting packages shown in FIG. 1.
Figure 13:
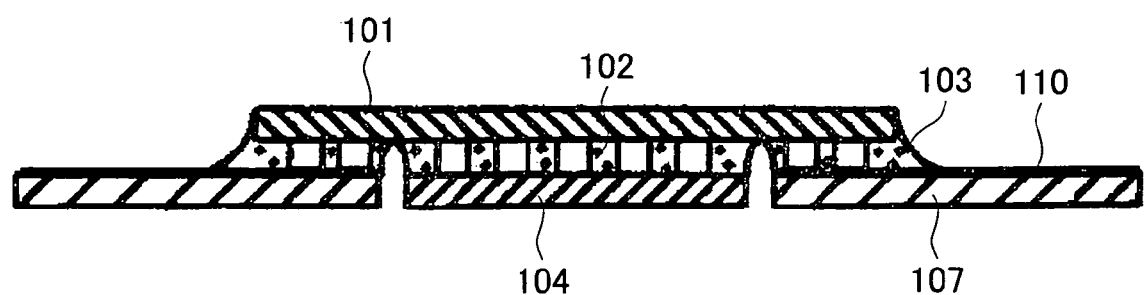
FIG. 13 is a cross-sectional view of a conventional structure.
Figure 14:
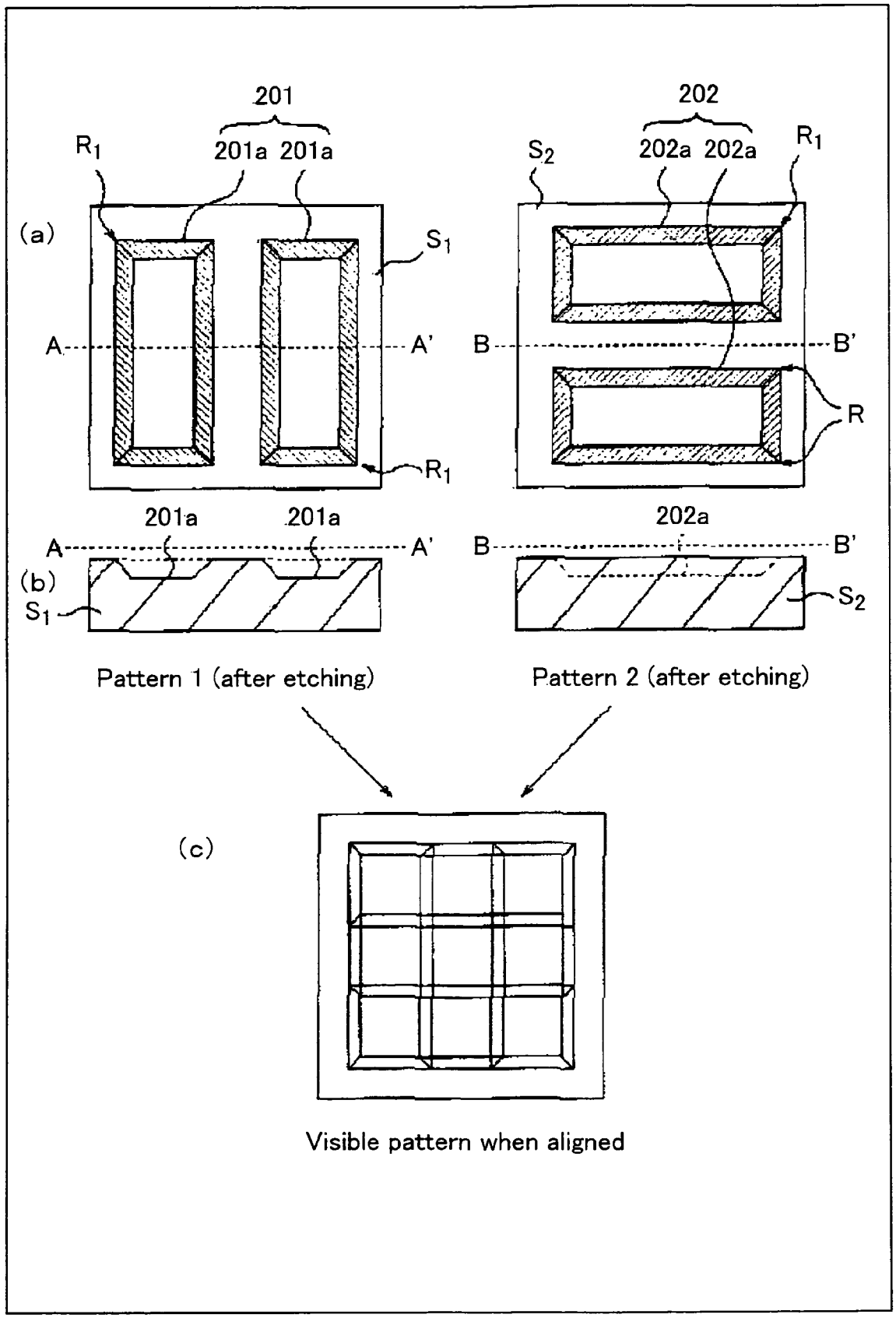
FIG. 14 is a drawing illustrating conventional art.

FIG. 12 is an oblique view of the structure of a liquid-crystal-driver-incorporating display device, an embodiment of the present invention. The liquid-crystal-driver-incorporating display device 51 of the present embodiment includes a liquid crystal display means (image display member) 52 and liquid crystal driver mounting packages 1 each containing a liquid crystal driver 3 mounted to a tape carrier 2 via an interposer 4a, as illustrated in FIG. 12. In the liquid crystal driver mounting package 1, the tape carrier 2 has an output terminal section 45 and an input terminal section 46.

The liquid crystal display means 52 includes an active matrix substrate 25, a liquid crystal layer 26, and an opposite substrate 27. Opposite electrodes are formed on the opposite substrate 27.

As illustrated in FIG. 12, the active matrix substrate 25 is made of a glass substrate 20 and signal lines 21, pixels 24, etc. formed on the glass substrate 20. The pixels 24 each include a thin film transistor ("TFT") 22, or a switching element, a pixel electrode 23, and other components and are arranged in an XY matrix (two-dimensional matrix). The TFT 22 has a data electrode and a gate electrode connected respectively to a data electrode line 21a and a gate electrode line 21b.

The data electrode line 21a and the gate electrode line 21b extend in the row and column directions of the active matrix substrate 25 to connect to one of the liquid crystal drivers disposed on an edge of the glass substrate 20 to drive the associated electrode lines. The following description will only deal with the structure of the data electrode lines 21a shown in FIG. 12. The same description applies to the gate electrode lines 21b.

The data electrode lines extend to an edge of the glass substrate 20 where they are connected to drive signal output terminals of the output terminal section 45 in the liquid crystal driver mounting package 1. The connections are established, for example, by placing the drive signal output terminals formed on the output terminal section 45 with predetermined pitches and the data electrode lines formed on the edge of the glass substrate 20 with the same pitches on top of each other with an ACF intervening between them and subjecting them to thermocompression.

The signal input terminals of the input terminal section 46 in the liquid crystal driver mounting package 1 are connected to wires on the external wiring board 47. The wires of the external wiring board 47 provide display data and other control signals and power supply to the liquid crystal driver 3 via the tape carrier 2 and the interposer 4a.

The drive signals generated by the liquid crystal driver 3 from the display data are output via the interposer 4a to the drive signal output terminals in the liquid crystal driver mounting package 1 and then to the data electrode lines 21a so as to control light emission by the pixels 24.

As mentioned earlier, if the liquid crystal driver 3 which has fine pitch terminals is mounted to provide an increased number of outputs or achieve a reduced chip size, the liquid crystal driver mounting package 1 of the present invention hardly requires any change in wire pitch on the film base material (tape carrier) over existent technology because the intervening interposer 4a redistributes the fine pitch terminals to wide pitch terminals without sacrificing reliability. Therefore, the liquid-crystal-driver-incorporating display device can therefore be assembled without making changes to the existent steps. Thus, the liquid-crystal-driver-incorporating display device allows for improved performance and reduced cost while maintaining sufficient reliability.

The active matrix substrate 25 is a glass substrate 20 the present embodiment. The present invention is by no means limited to this example. Any conventional, publicly known substrate may be used provided it is transparent.

The liquid crystal driver 3 is used as the driver for the data electrode lines in the present embodiment. The present invention is by no means limited to this example. The driver 3 may be used as a liquid crystal driver for the gate electrode lines.

In the present embodiment, the first alignment marks are formed in the same layer and of the same material as the drive signal output terminals 3a and the signal input terminals 3b. Furthermore, the second alignment marks are formed in the same layer and of the same material as the wiring conductor on the interposer 4a. The present invention is by no means limited to this example. As an alternative example, the first alignment marks may be formed in the same layer and of the same material as the drive signal output terminals 3a and the signal input terminals 3b, and the second alignment marks may be formed of a metal in a different layer from the wiring conductor on the interposer 4a. A further alternative example is to form the first alignment marks of a metal in a different layer from the drive signal output terminals 3a and the signal input terminals 3b and form the second alignment marks in the same layer and of the same material as the wiring conductor on the interposer 4a.

The present embodiment describes a liquid crystal driver mounting package adapted to drive a liquid crystal display member. The IC chip package of the present invention is by no means limited to this example. The IC chip package may be used, for example, as a package for drivers for an EL (electroluminescence) display member and devices for various mobile electronics.

Embodiment 2

Figure 9:
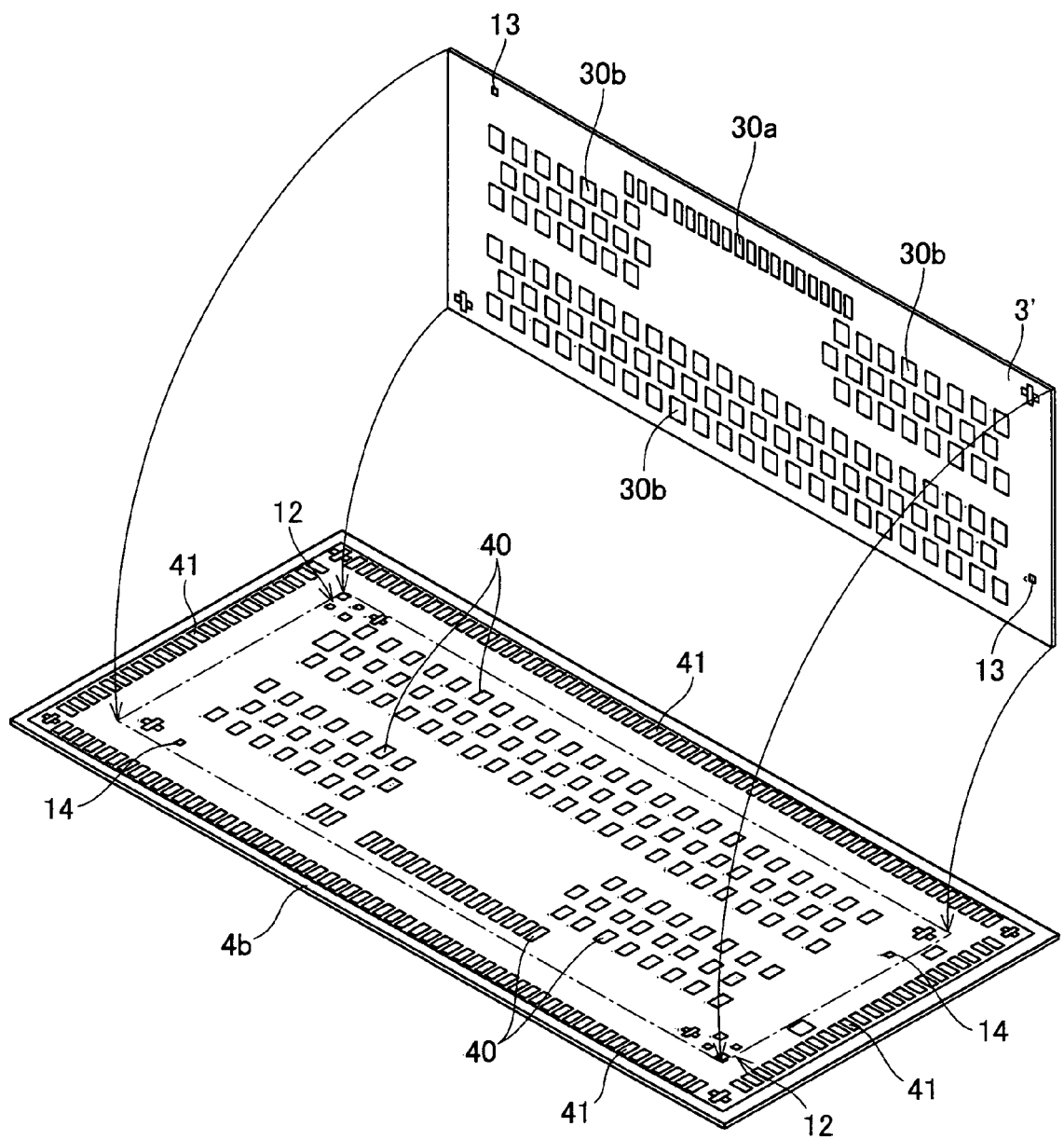
FIG. 9 is a drawing illustrating the structure of the opposing faces of a liquid crystal driver and an interposer provided in a liquid crystal driver mounting package in accordance with another embodiment of the present invention.

The following will describe another embodiment in accordance with the present invention in reference to FIG. 9. Here, for convenience in description of differences from embodiment 1, members of the present embodiment that have the same arrangement and function as members of embodiment 1, and that are mentioned in that embodiment are indicated by the same reference numerals and description thereof is omitted.

FIG. 9 is a drawing illustrating the structure of the opposing faces of a liquid crystal driver 3' and an interposer 4b provided in a liquid crystal driver mounting package of the present embodiment. FIG. 9 shows the same state as FIG. 4 in embodiment 1.

As mentioned earlier, apart from regulating combining positions for the liquid crystal driver 3 and the interposer 4a described in embodiment 1, it is preferable in liquid crystal driver mounting packages and other IC packaging to control the distance (gap) between the liquid crystal driver 3 and the interposer 4a to provide high product precision packages. Accordingly, in the present embodiment, there are provided first gap measurement members 13, as well as first alignment marks 11, on the face of the liquid crystal driver 3' where input bumps 30a and output bumps 30b are provided. Furthermore in the present embodiment, there are provided second gap measurement members 14, as well as second alignment marks 12, on the face of the interposer 4b where liquid crystal driver connecting bumps 40 are provided.

The first gap measurement members 13 are formed at two opposite corner areas, devoid of the first alignment marks 11, of the face of the liquid crystal driver 3' where the input bumps 30a and the output bumps 30b are provided and also halfway along the long side of that face. Details will be given next in reference to FIG. 10.

Figure 10:
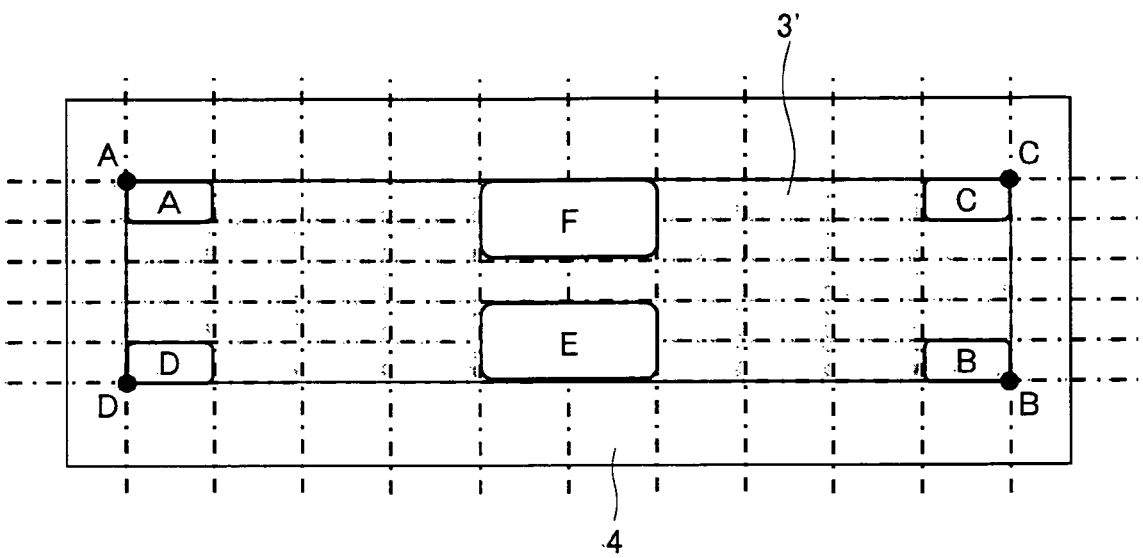
FIG. 10 is a plan view of the structure of the liquid crystal driver and the interposer provided in the liquid crystal driver mounting package shown in FIG. 9.

FIG. 10 is a plan view of the liquid crystal driver 3' and the interposer 4b which were removed from the liquid crystal driver mounting package of the present embodiment. FIG. 10 shows the same state as FIG. 5 in embodiment 1. The first gap measurement members 13 are provided in area C and area D and also in area E and area F shown in FIG. 10. Area C and area D each stretch 1/10 the long side of the liquid crystal driver 3' and 1/5 the short side from its corner, similarly to area A and area B. These areas C and D do not affect the connection of the input bumps 30a and the output bumps 30b to the liquid crystal driver connecting bumps 40 on the interposer 4a. It is therefore preferable to provide the first gap measurement members 13 in the areas.

The second gap measurement members 14 are provided in the areas opposite areas C and D of the liquid crystal driver 3' shown in FIG. 10 and also in the areas opposite areas E and F so that the first gap measurement members 13 and the second gap measurement members 14 are next to each other when observed from the normal to the face of the interposer 4b where the liquid crystal driver connecting bumps 40 are provided.

Next, the structure of the first gap measurement members 13 and the second gap measurement members 14 will be described more specifically in reference to FIG. 11.

Figure 11:
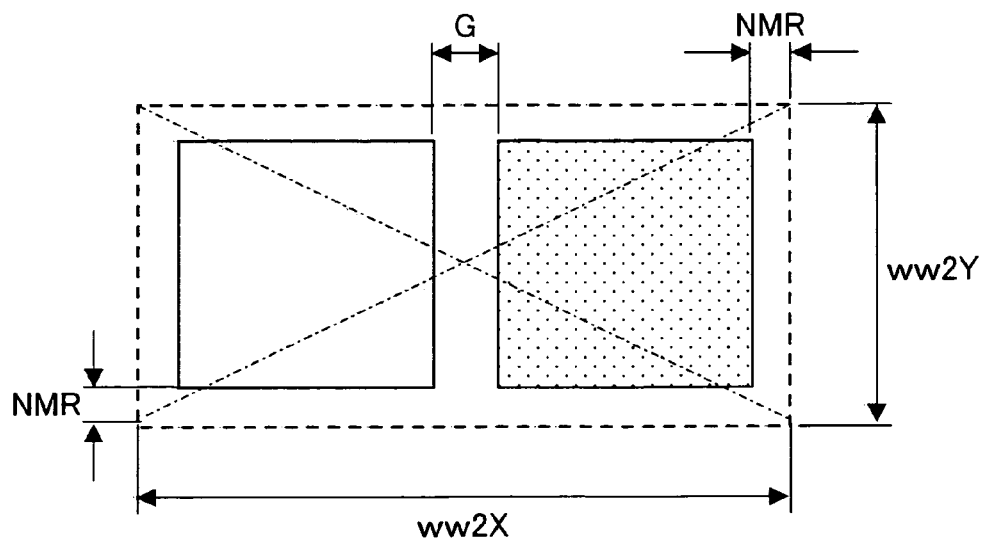
FIG. 11 is a drawing illustrating the relative positions of a first gap measurement member and a second gap measurement member provided in the liquid crystal driver mounting package shown in FIG. 9.

FIG. 11 is a plan view showing the positions of a first gap measurement member 13 and a second gap measurement member 14 when the area C, D, E, or F shown in FIG. 10 is viewed from the normal to the face of the interposer 4b where the liquid crystal driver connecting bumps 40 are provided, with the opposing faces of the liquid crystal driver 3' and the interposer 4b shown in FIG. 9 positioned opposite each other. When viewed from the normal, the first gap measurement member 13 and the second gap measurement member 14 appear next to each other as illustrated in FIG. 11. The members 13 and 14 are separated by a predetermined distance from each other.

The first gap measurement member 13 is preferably formed in the same steps as the drive signal output terminals 3a and the signal input terminal 3 are formed. Therefore, the member 13 is preferably formed in the same layer as the drive signal output terminals 3a and the signal input terminals 3b and of the same material as the drive signal output terminals 3a and the signal input terminals 3b. Likewise, the second gap measurement member 14 is preferably formed in the same steps as the wiring conductor (not shown) is formed. Therefore, the member 14 is preferably formed in the same layer as the wiring conductor and of the same material the wiring conductor.

The first gap measurement member 13 and the second gap measurement member 14 may be designed to have a height of 1 μm (measured respectively from the face where the input bumps 30a and the output bumps 30b are provided and from the face where the liquid crystal driver connecting bumps 40 are provided).

The distance separating the first gap measurement member 13 and the second gap measurement member 14 is measured by emitting, to the members 13 and 14, the light that is used in the detection of the first alignment marks 11 and the second alignment marks 12 in embodiment 1. Specifically, the light is shone onto the first gap measurement member 13 and the second gap measurement member 14. Reflection of the light is used to obtain distance, for example, from the emission member of the light, the reception member of the reflection, or opposite the opposing faces of the liquid crystal driver 3' and the interposer 4a to the first gap measurement member 13 and the second gap measurement members. From this distance, the distance (gap) between the first gap measurement member 13 and the second gap measurement member 14 is calculated.

The first gap measurement member 13 and the second gap measurement member 14 are not limited in any particular manner in terms of their size (area when viewed from the normal). Each member 13 and 14 however preferably has an area of at least 15 μm² because the gap distance is obtained by reflecting light as above.

Since the gap distance between the first gap measurement member 13 and the second gap measurement member 14 is obtained from reflection as above, it is preferable if no other structural members that may reflect the light or disrupt the emission of the light are disposed on and near the first gap measurement member 13 and the second gap measurement member 14 in liquid crystal driver mounting package of the present embodiment. Examples of such structural members include metal-containing members.

The following table gives values of the distances shown in FIG. 11.

TABLE 2

| Symbol | (μm) | Note |
| --- | --- | --- |
| WW2X | ≦38 | Length of Metal Disposition Prohibited Area |
| WW2Y | ≦18 | Length of Metal Disposition Prohibited Area |
| NMR | ≧1.5 | Distance of Metal Disposition Prohibited Area |
| G | 5 | Distance between First Gap Measurement Member and Second Gap Measurement Member |

The "metal disposition prohibited area" in the table refers to an area where it is prohibited to dispose other structural members which may disrupt the emission of the light.

As described in the foregoing, according to the arrangement of the present embodiment, in addition to the effects of embodiment 1, the distance (gap) between the liquid crystal driver 3' and the interposer 4b can be controlled after the driver 3' and the interposer 4b are attached. The distance (gap) between the liquid crystal driver 3' and the interposer 4b after they are attached corresponds to the height of the bumps forming the bump-to-bump contacts between the liquid crystal driver 3' and the interposer 4b. Thus, if the liquid crystal driver 3' and the interposer 4b are provided with bumps of predetermined heights before they are attached, it is possible to know to what degrees the bumps are crushed by joining, in other words, how the resultant joints are. For example, suppose that the liquid crystal driver 3' and the interposer 4b are provided with 7.5-µm high bumps before they are attached. If the gap distance between the liquid crystal driver 3' and the interposer 4b obtained by the above technique after attaching is 11 µm, the bump-to-bump joints have crushed about 4 µm of the bumps. If a criterion is set up to evaluate these bump-to-bump joints as being acceptable, for example, bump-to-bump joints can be determined in the manufacture of other packages to have poor quality when the gap distance is larger than 11 µm. Alternatively, when the gap distance is less than 11 µm (for example, 7 µm), the distance indicates that the bumps have been crushed more than designed, and there could be a possibility that the bumps may be undesirably contact other members.

In the present embodiment, the first gap measurement members 13 and the second gap measurement members 14 are provided in area C and area D and also in area E and area F shown in FIG. 10. The present invention is by no means limited to this example. The members 13 and 14 may be provided either only in area C and area D or only in area E and area F. Furthermore, the first gap measurement members 13 and the second gap measurement members 14 may be provided at positions other than in area C and area D and area E and area F, so long as the first gap measurement members 13 and the second gap measurement members 14 can be observed by the technique. For example, the members 13 and 14 may be provided together with the first alignment marks 11 and the second alignment marks 12 in area A and area B where the first alignment marks 11 and the second alignment marks 12 are provided.

the first gap measurement members 13 and the second gap measurement members 14 are provided along with the first alignment marks 11 and the second alignment marks 12 in the present embodiment. The present invention is by no means limited to this example. Only the first gap measurement members 13 and the second gap measurement members 14 may be provided as a means by which to verify how the liquid crystal driver 3' and the interposer 4b are attached, with no first alignment marks 11 and second alignment marks 12 being provided.

The present invention is not limited to the description of the embodiments above, but may be altered by a skilled person within the scope of the claims. An embodiment based on a proper combination of technical means disclosed in different embodiments is encompassed in the technical scope of the present invention.

An IC chip package in accordance with the present invention, as described in the foregoing, is characterized in that it is an IC chip package in which an IC chip is mounted to a package base material via an interposer, the IC chip containing electrodes and first positioning members on a face thereof opposite the interposer, the first positioning members indicating a combining position for the IC chip and the interposer, the interposer containing wiring conductor and second positioning members on a face thereof opposite the IC chip, the wiring conductor having IC chip contacts electrically connected to the electrodes and package base material contacts electrically connected to the package base material, the second positioning members being provided in pairs with the first positioning members, the first positioning members being provided in the same layer as the electrodes and formed of the same material as the electrodes and/or the second positioning members being provided in the same layer as the wiring conductor and formed of the same material as the wiring conductor.

According to the arrangement, unlike conventional technology, the positioning members can be provided without reducing package manufacturing throughput. The arrangement therefore greatly restrains rise in manufacturing cost when compared with conventional arrangements.

Another IC chip package in accordance with the present invention, as described in the foregoing, is characterized in that it is an IC chip package in which an IC chip is mounted to a package base material via an interposer, the IC chip containing electrodes on a face thereof opposite the interposer, the interposer containing wiring conductor having IC chip contacts electrically connected to the electrodes and package base material contacts electrically connected to the package base material, the electrodes and the IC chip contacts being electrically connected via bumps, the IC chip having, at a position thereon opposite the interposer, first gap measurement members for measuring a gap between the opposing faces of the IC chip and the interposer, and the interposer having, at a position thereon opposite the IC chip, second gap measurement members provided in pairs with the first gap measurement members.

The arrangement enables control of the distance (gap) separating the IC chip from the interposer and hence evaluation as to whether the electrodes of the IC chip and the IC chip contacts of the interposer are sufficiently connected via the bumps.

An image display device in accordance with the present invention is, as described in the foregoing, characterized in that it includes: IC chip packages structured as above; and a display image display member, connected to the package base material in the IC chip packages, for displaying images from signal outputs from the IC chip.

The arrangement provides a highly reliable image display device.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and the scope of the invention as hereinafter claimed.

INDUSTRIAL APPLICABILITY

An IC chip (e.g. liquid crystal driver) mounting package of the present invention is an IC chip package in which an IC chip is mounted to a tape carrier via an interposer. The IC chip and the interposer have, on their opposing faces, contain positioning means for positing in the attaching of the chip and interposer. The positioning means are at positions separated from each other by about a distance which is in a tolerable range as a combining position when viewed from the normal to the opposing faces. Simply (visually) detecting the relative positions of the positioning means on the chip and interposer can therefore determine whether or not the positioning means is positioned in a tolerable range as a combining position. Efficient positing is thus possible.

Therefore, the IC chip package may be used as a liquid crystal driver mounting package adapted to drive a liquid crystal display member. The package may also be used as a package for drivers for an EL (electroluminescence) display member and devices for various mobile electronic.

The invention claimed is:

1. An IC chip package in which an IC chip is mounted to a package base material via an interposer,
the IC chip comprising electrodes and first positioning members on a face thereof opposite the interposer, the first positioning members indicating a combining position for the IC chip and the interposer,
the interposer comprising wiring conductor and second positioning members on a face thereof opposite the IC chip, the wiring conductor having IC chip contacts electrically connected to the electrodes and package base material contacts electrically connected to the package base material, the second positioning members being provided in pairs with the first positioning members,
the first positioning members being provided in the same layer as the electrodes and formed of the same material as the electrodes, wherein the first and second positioning members differ in shape and are provided so that the first and second positioning members are separated by about a distance which is in a tolerable range as the combining position when viewed from a normal to the opposing faces of the IC chip and the interposer with the IC chip and the interposer being attached at an optimal position and wherein the distance separating the first and second positioning members has at least two values, one of the values indicating a limit for positional tolerable error and being greater than the other one of the values.

2. The IC chip package as set forth in claim 1, wherein the second positioning members are provided in the same layer as the wiring conductor and formed of the same material as the wiring conductor.

3. An IC chip package in which an IC chip is mounted to a package base material via an interposer,
the IC chip comprising electrodes and first positioning members on a face thereof opposite the interposer, the first positioning members indicating a combining position for the IC chip and the interposer,
the interposer comprising wiring conductor and second positioning members on a face thereof opposite the IC chip, the wiring conductor having IC chip contacts electrically connected to the electrodes and package base material contacts electrically connected to the package base material, the second positioning members being provided in pairs with the first positioning members,
the second positioning members being provided in the same layer as the wiring conductor and formed of the same material as the wiring conductor, wherein the first and second positioning members differ in shape and are provided so that the first and second positioning members are separated by about a distance which is in a tolerable range as the combining position when viewed from a normal to the opposing faces of the IC chip and the interposer with the IC chip and the interposer being attached at an optimal position and wherein the distance separating the first and second positioning members has at least two values, one of the values indicating a limit for positional tolerable error and being greater than the other one of the values.

4. The IC chip package as set forth in claim 3, wherein:
the face of the IC chip opposite the interposer is quadrilateral; and
the first positioning members are provided in four corner areas of the quadrilateral.

5. The IC chip package as set forth in claim 3, wherein:
the face of the IC chip opposite the interposer is quadrilateral; and
the first positioning members are provided in two opposite corner areas of the quadrilateral across a center of the quadrilateral.

6. The IC chip package as set forth in claim 5, wherein:
the face of the IC chip opposite the interposer is rectangular; and
the corner areas each stretch $1/10$ a long side of the rectangle from a corner of the rectangle and $1/5$ a short side of the rectangle from the corner of the rectangle.

7. The IC chip package as set forth in claim 4, wherein each of the first positioning members provided in the two opposite corner areas across the center of the face of the IC chip opposite the interposer has a different shape.

8. The IC chip package as set forth in claim 7, wherein the first positioning members provided in one of the two corner areas have the same shape as the second positioning members provided in pairs with the first positioning members provided in the other corner area.

9. The IC chip package as set forth in claim 3, wherein either the first positioning members or the second positioning members each include a plurality of positioning members and are arranged to surround the other ones of the first and second positioning members when viewed from the normal.

10. The IC chip package as set forth in claim 9, wherein:
the plurality of positioning members are two pairs of positioning members provided across the other ones;
one of the two pairs is separated from the other ones by about a distance indicating a positional tolerance limit; and
the other one of the pairs is separated from the other ones by a shorter distance than the previous distance.

11. The IC chip package as set forth in claim 9, wherein:
the positioning members are square;
the other ones are shaped like crosses where two rectangles cross at centers thereof at right angles;
the positioning members are each provided between an extension from a center of one of the crosses and an adjacent extension from the center and positioned so that a corner of the square points at the center of the cross.

12. The IC chip package as set forth in claim 11, wherein:
the first and second positioning members contains a metal; and
no metal-containing members other than the first and second positioning members are located at positions where the first and second positioning members are located when the IC chip and the interposer are viewed from the normal.

13. The IC chip package as set forth in claim 3, wherein the first and second positioning members provided in pairs have conductive projections on the opposing faces of the IC chip and the interposer to establish contacts, the projection having external wires.

14. The IC chip package as set forth in claim 3, wherein:
the electrodes and the IC chip contacts are electrically connected via bumps; and
the first and second positioning members double as gap measurement members for measuring a gap between the opposing faces of the IC chip and the interposer.

15. The IC chip package as set forth in claim 3, wherein:
the electrodes and the IC chip contacts are electrically connected via bumps;
the IC chip has, on the face thereof opposite the interposer, first gap measurement members for measuring a gap between the opposing faces of the IC chip and the interposer; and the interposer has, on the face thereof opposite the IC chip, second gap measurement members provided in pairs with the first gap measurement members.

16. The IC chip package as set forth in claim 15, wherein the first and second gap measurement members are provided so that gap measurement members are next to each other when viewed from the normal to the opposing faces of the IC chip and the interposer.

17. The IC chip package as set forth in claim 5, wherein:
the electrodes and the IC chip contacts are electrically connected via bumps;
the IC chip has, at a position thereon opposite the interposer, first gap measurement members for measuring a gap between the opposing faces of the IC chip and the interposer;
the interposer has, at a position thereon opposite the IC chip, second gap measurement members provided in pairs with the first gap measurement members; and
the first and second gap measurement members are arranged so that they are in two corner areas other than the two previously defined corner areas of the IC chip when viewed from the normal to the opposing faces of the IC chip and the interposer.

18. The IC chip package as set forth in claim 15, wherein the first and second gap measurement members have an area of at least 15 $\mu m^2$ when viewed from the normal to the opposing faces of the IC chip and the interposer.

19. The IC chip package as set forth in claim 15, wherein:
the interposer is a semiconductor substrate on which an electric circuit is formed; and
the first and second gap measurement members are composed of a material reflecting light transmitted by the semiconductor.

20. An image display device, comprising:
IC chip packages as set forth in claim 3; and
a display image display member, connected to the package base material in the IC chip packages, for displaying an image from signal outputs from the IC chip.

* * * * *